United States Patent [19]

Kawashima et al.

[11] Patent Number: 5,192,087
[45] Date of Patent: Mar. 9, 1993

[54] DEVICE FOR SUPPORTING A WAFER

[75] Inventors: Hideaki Kawashima; Kouhei Eguchi, both of Sagamihara, Japan

[73] Assignee: Nippon Steel Corporation, Tokyo, Japan

[21] Appl. No.: 769,432

[22] Filed: Oct. 2, 1991

[30] Foreign Application Priority Data

Oct. 2, 1990 [JP] Japan .................................. 2-264488
Oct. 12, 1990 [JP] Japan .................................. 2-274566

[51] Int. Cl.⁵ ........................................... B23B 31/171
[52] U.S. Cl. ...................... 279/71; 118/503; 279/110
[58] Field of Search ............... 279/1 L, 81, 71, 114, 279/121, 127, 132, 133, 4.12, 110; 269/106, 107, 233, 903; 118/500, 503

[56] References Cited

U.S. PATENT DOCUMENTS

| 95,337 | 9/1869 | Goulden | 269/119 |
| 463,392 | 11/1891 | Skinner | 279/112 |
| 1,433,818 | 10/1922 | Hill | 279/114 X |
| 2,421,281 | 5/1947 | McKay et al. | 279/123 X |
| 3,026,128 | 3/1962 | Willis | 279/114 X |
| 3,814,449 | 6/1974 | Buck | 279/127 X |
| 3,975,030 | 8/1976 | Akeel et al. | 279/137 X |
| 4,062,318 | 12/1977 | Ban et al. | 118/500 X |
| 4,238,526 | 12/1980 | Chitouras | 118/500 X |
| 4,482,162 | 11/1984 | Anegawa | 279/137 X |

FOREIGN PATENT DOCUMENTS 61-53739 3/1986 Japan .
61-239636 10/1986 Japan .

Primary Examiner—Steven C. Bishop
Attorney, Agent, or Firm—Steven M. Rabin

[57] ABSTRACT

A device for supporting a wafer comprises a base plate for arranging the wafer thereabove and a plurality of supports circumferentially arranged on the base plate to support the peripheral of the wafer. In order to expose portions of the wafer covered by the supports, either an annular member to engage with the supports for moving them radially outward, or a roller driven by a motor to rotate the wafer relative to the supports is provided.

5 Claims, 5 Drawing Sheets

DEVICE FOR SUPPORTING A WAFER

BACKGROUND OF THE INVENTION

1. Field of the Invention

The present invention relates to a device for supporting a wafer employed in producing semi-conductors.

2. Description of the Related Art

Among the processes of manufacturing semi-conductors, concerning the application of various treatments on the wafer, the wafer is generally held and supported in a vacuum or a liquid.

A conventional and well known device for supporting a wafer, is a device that supports an outer periphery of the wafer mechanically.

In such conventional devices for supporting the wafer, the wafer is generally grasped at several portions thereof by corresponding grasping members, and the wafer is immersed in a wash and oscillated in a washer, so that the face and the back of the wafer can be cleaned.

However, according to the conventional supporting devices as described above, wafer-portions directly grasped by the grasping members cannot be treated as well as the other wafer-portions not grasped by the members because of the protecting effect of the grasping member itself. Namely, for example, the wafer-portions grasped by the members may not be cleaned.

SUMMARY OF THE INVENTION

An object of the present invention is to provide a device for supporting a wafer, in such a way that the wafer-portions directly supported by the supporting members can be treated as other wafer-portions directly exposed to a treating liquid.

Therefore, according to the present invention, there is provided a device for supporting a wafer, comprising:

a base plate for arranging the wafer thereabove;

a plurality of supports circumferentially arranged on said base plate to support the peripheral of the wafer; and means for moving said supports radically outward to expose wafer-portions that had been supported by said support.

Furthermore, according to the invention, there is also provided a device for supporting a wafer, comprising:

a base plate for arranging the wafer to be supported thereabove;

a plurality of supports circumferentially arranged on said base plate to support the periphery of the wafer; and means for moving the wafer to expose wafer-portions that had been supported by said supports to the outside.

The present invention will be more fully understood from the description of the preferred embodiments thereof set forth below, together with the accompanying drawings.

DESCRIPTION OF THE PREFERRED EMBODIMENTS

Figure 1:
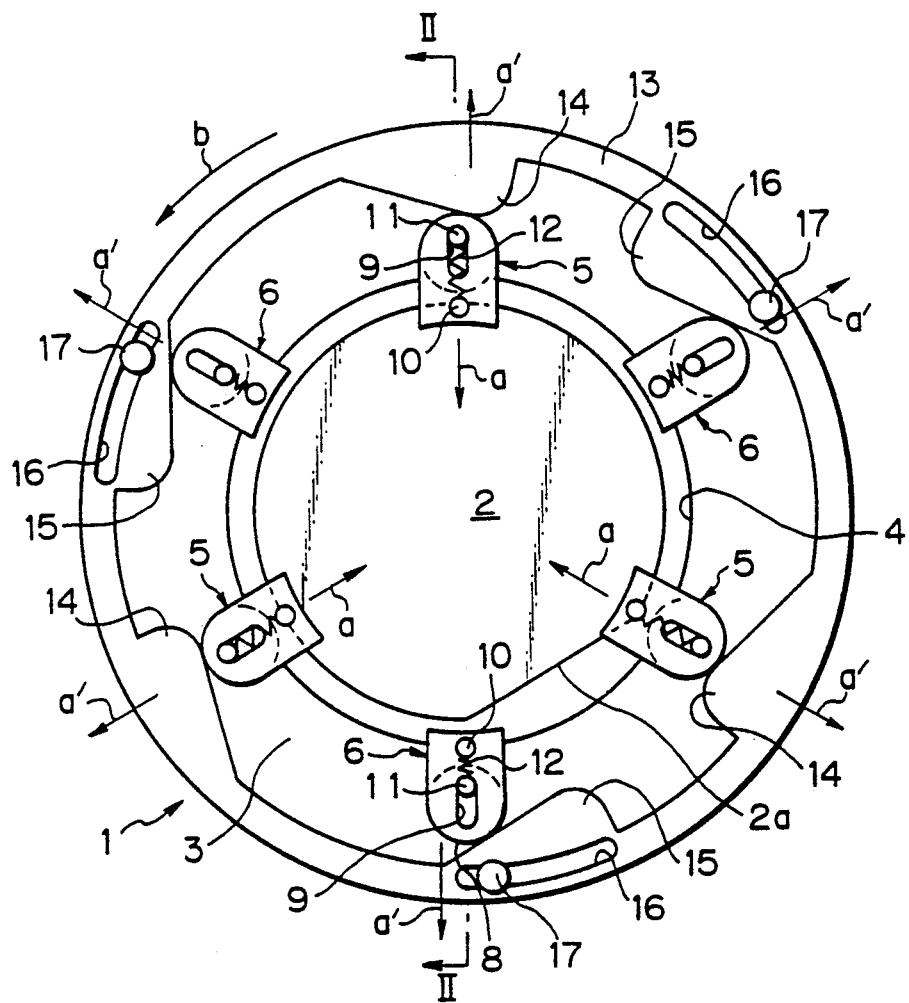
FIG. 1 is a plan view of a device for supporting a wafer according to a first embodiment of the invention.
Figure 2:
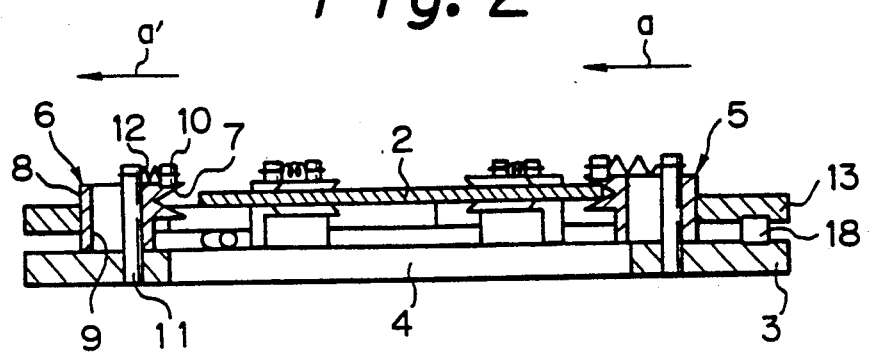
FIG. 2 is a longitudinal sectional view taken along the line II—II of FIG. 1.
Figure 3:
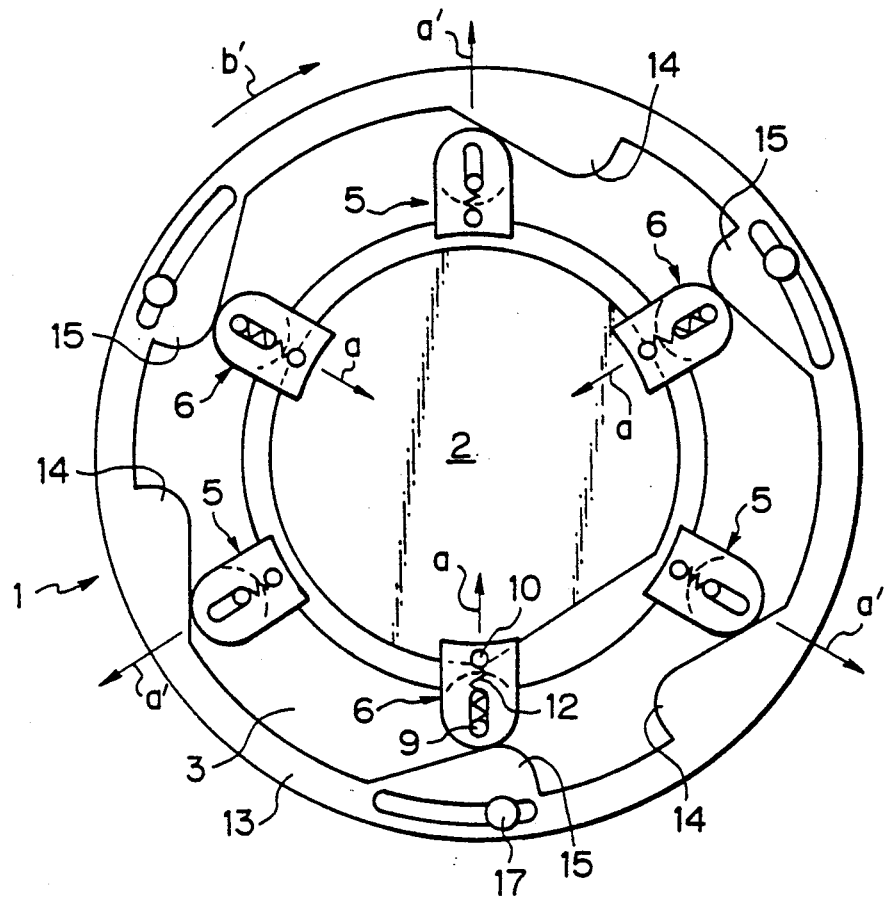
FIG. 3 is a plan view of a device similar to FIG. 1, showing a supporting condition different from that of FIG. 1.

FIG. 1, 2 and 3 show a device for supporting a wafer in accordance with a first embodiment of the present invention. In FIG. 1, reference numeral 1 designates the device of the invention for supporting the wafer 2 invention, wherein base plate 3 is provided at a center thereof with a circular opening 4.

Arranged on the base plate 3 and around the opening 4 circumferentially are six supports that are constituted by three first supports 5 comprising a first group and the remaining three second supports 6 comprising a second group, corresponding to functions thereof, which will be later described.

As shown in FIG. 1, the first and second supports 5 and 6 are placed alternately at regular intervals. As shown in FIG. 2, each of the supports 5 and 6 has a V-shaped groove 7 formed at a front end thereof facing the opening 4. According to this embodiment, each V-shaped groove 7 of the supports 5 and 6 provide a supporting or grasping part thereof against the wafer 2.

At a rear portion opposite the groove 7, each support 5 and 6 is formed so as to have a cylindrical part 8 having an elongated hole 9 formed therethrough. Furthermore, each support 5 and 6 is provided with a pin 10 embedded therein in the vicinity of the front end.

Corresponding to the supports 5 and 6, six guide pins 11 are fixed to the base plate 3 in such a manner that each guide pin 11 stands upright and passes through each hole 9 of the support 5 and 6, respectively. Due to engagement of the guide pin 11 into the elongated hole 9, each support 5 and 6 can be constructed so as to move radially inward in the direction of a and to move radially outward in the direction of a'. Note to make sure of the radial movement, the guide pin 11 may be formed so that a cross section thereof is substantially elliptic (not shown), and similar to the shape of the elongated hole 9.

A top part of each guide pin 11, which protrudes from a top surface of the support 5 and 6, is connected to an end of a tensile spring 12 which has another end connected to the pin 10. Owing to the pulling function of the spring 12, each support 5 and 6 is urged in the direction of a', so that the pin 10 is moved close to the guide pin 11 in a free state under which external force is exerted on the support 5 and 6.

As means for moving the supports 5 and 6 constructed as above, there is provided an annular member 13 rotatably mounted on the base plate 3 and inside which all of the supports 5 and 6 are positioned inscribing thereto. The annular member 13 includes an inside surface thereof which defines a plurality of internal projections.

According to this embodiment, the internal projections are constituted by three first projections 14, each of which has a contour inclined to an arc of the inside surface of the member 13 to engage with each first support 5, and three second projections 15, each of which has also a contour inclined to the arc of the inside surface of the member 13 to engage with each second support 6. The inclination of the first projection 14 is directed opposite that of the second projection 15.

The annular member 13 includes three arcuate long holes 16 into which corresponding guide pins 17 secured on the base plate 3 engage respectively. To prevent the member 13 from disengaging with the base plate 3, a head part of each guide pin 17 is preferably formed larger than the width of the long hole 16. Further, the annular member 13 is supported by ball bearings 18 mounted on the base plate 3 whereby the member 13 can be rotated smoothly in the opposite circumferential directions of b in FIG. 1 and b' in FIG. 3.

The device 1 for supporting the wafer 2 as constructed hereinabove operates as follows.

In a first operating state where the annular member 13 is rotated in the direction of b as shown in FIG. 1, each of the first supports 5 is moved radially inward (in the direction of a) by each first projection 14, overcoming a tensile strength derived from the tensile spring 12. Consequently, each support 5 will occupy a position for supporting the wafer 2, referred to as "the supporting position" hereinafter, and whereby three peripheral portions of the wafer 2 can be supported by the first supports 5.

On the other hand, in the first operating state, each of the second supports 6 are moved radially outward (the direction of a') by the tensile strength of the spring 12, since three contacts of the supports 6 with the second projections 15 more close to the arc of the internal surface of the member 13. Consequently, each support 6 will occupy a position departing from the wafer 2, referred to as "the releasing position" hereinafter, and whereby the second supports 6 are removed from the wafer 6.

Next, in the second operating state where the annular member 13 is rotated in the direction of b' as shown in FIG. 3, each of the second supports 6 is moved radially inward (the direction of a) by each second projection 15, overcoming a tensile strength derived from the tensile spring 12. Consequently, each support 6 will occupy the supporting position, whereby three peripheral portions of the wafer 2, which are different from the previous peripheral portions, can be supported by the second supports 6.

Also, in this second operating state, each of the first supports 5 are moved radially outward (the direction of a') by the tensile strength of the spring 12, since three contacts of the supports 5 with the first projection 14 moves close to the internal arc of the member 13. Consequently, each support 5 will occupy the releasing position, whereby the second supports 5 are separated from the wafer 2. Note, in connection with the aforementioned supporting configuration of the device 1, the above supporting positions attained by the supports 5 and 6 are defined so that even a straight part 2a of the wafer 2, which is generally called "an orientation flat", can be supported sufficiently by the supports 5 and 6.

As described above, according to the first embodiment, by rotating the annular member 13 in either direction b or b' selectively, it enables the selection of either the supporting condition by the supports 5 or the same by the supports 6, and thus the different peripheral portions of the wafer 2 can be supported alternately.

The supporting device 1 may be mounted on a moving arm (not shown) extending from an apparatus such as a wafer cleaning instrument, so that such rotations of the annular member 13 may be attained by a driving mechanism (not shown) provided in the apparatus.

Figure 4A:
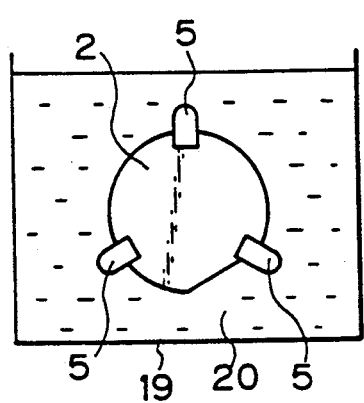
FIGS. 4A and 4B are schematic views, showing supporting operations of the device according to the first embodiment of the invention.
Figure 4B:
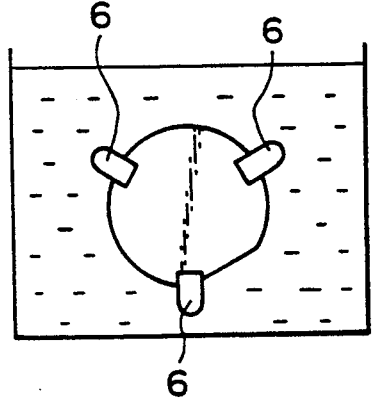

FIGS. 4A and 4B show two supporting configurations in a cleaning precess of the wafer 2, which correspond to the above-mentioned first and second operating states, respectively, and in which only supports 5 or 6, serving to support the wafer 2, are illustrated to express the positions of supports 5 and 6 clearly.

Namely, as an example, in the former half of the cleaning process as shown in FIG. 4A, the wafer 2 is supported by the first supports 5 to be cleaned in a washer 19 filled with a wash 20. Then, in the latter half shown in FIG. 4B, the wafer 2 is supported by the second supports 6. Consequently, the three peripheral portions of the wafer 2 where the cleaning treatment has been incomplete in the former half, can be effectively cleaned.

Note, the projections 14 and 15 are so constructed that, during the course of the condition of FIG. 1 to that of FIG. 3, the wafer 2 can be always supported by at least either of the supports 5 or the supports 6 in order to prevent the wafer 2 from falling off the device 1.

According to this embodiment, by providing the base plate 3 with the opening 4, it is possible for the wash 20 to flow from the reverse side of the device 1 to the wafer 2, so that the back surface thereof can be cleaned very well.

Regarding the attaching or detaching of the wafer 2, if only the annular member 13 is further rotated in excess of the condition of FIG. 1 in the direction of b, the supports 5 would move radially outward and come off the wafer 2 since each contact of the projection 14 with the support 5 passes through a pointed end of the projection 14.

Figure 5:
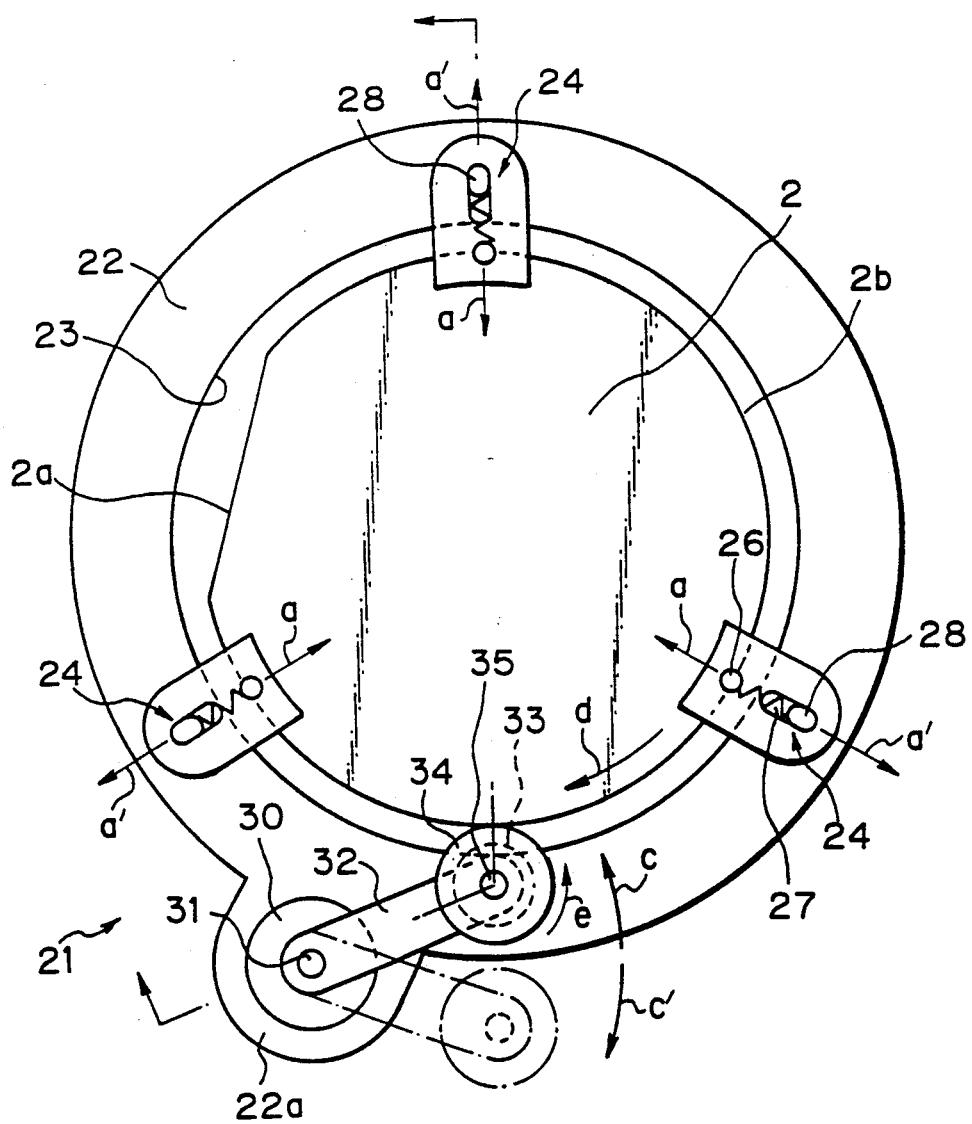
FIG. 5 is a plan view of a device for supporting a wafer, according to a second embodiment of the invention.
Figure 6:
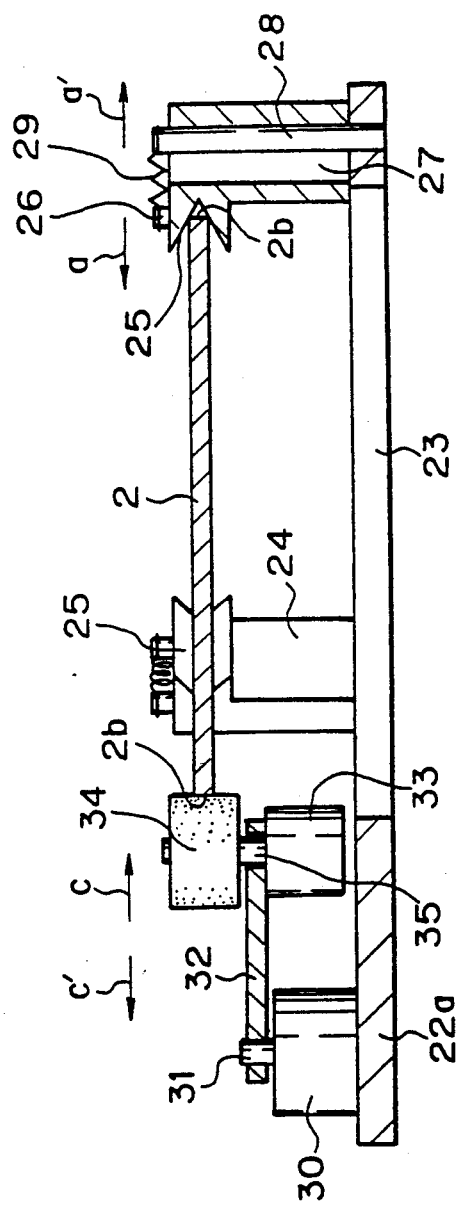
FIG. 6 is a longitudinal sectional view taken along the line VI—VI of FIG. 5.

FIGS. 5 and 6 show a second embodiment of the present invention. Note, in this embodiment, as well as in the first embodiment described hereinbefore, elements similar to those of the first embodiment shown in FIGS. 1 to 3 are indicated by the same reference numerals.

Similarly to the device 1 in the first embodiment, a device 2 in accordance with the second embodiment includes a base plate 22 having a circular opening 23 formed at a center thereof.

To support the wafer 2, three supports 24 are circumferentially arranged on the base plate 22 and around the opening 23 at regular intervals. As shown in FIG. 6, each support 24 is formed so as to be substantial L-shaped and has a V-shaped groove 25 formed at a front end thereof, by which the wafer 2 is rotatably supported. Note, the support 24 may be made of resin material such as Teflon (trade mark).

Further, each support 24 has a pin 26 embedded on a top side thereof in the vicinity of the front end and an elongated hole 27 formed to extend from the top side to the bottom side thereof.

Corresponding to the supports 24, three guide pins 28 are fixed to the base plate 22 so as to stand upright therefrom and to pass through the holes 27, respectively. Each guide pin 28 is connected at a top part thereof to each pin 26 of the support 24 of a compression spring 29, respectively.

Due to an urging action by each spring 28, each support 24 is urged radially inward in the direction of a, so that the front end of the support 24 protrudes into the opening 23 of the base plate 22 in a free state and whereby the wafer 2 can be rotatably supported as shown in FIG. 5. Note, in the case of attaching the wafer 2 to the device 21 prior to an operation thereof, the supports 24 are moved on the base plate 22 radially outward in the direction of a' by a suitable means such as a driving mechanism (not shown).

The base plate 22 has a protruding part 22a at a periphery thereof, on which a pivotal mechanism 30 such as a stepping motor is mounted. The mechanism 30 is provided with a pivotal shaft 31 that fixes a pivot arm 32.

Arranged in the vicinity of an end of the pivot arm 32 and mounted on an underside thereof is a motor 33 that rotates a roller 34 via a motor shaft 35.

As shown in FIG. 5, due to pivotal movements in both directions c and c' by the mechanism 30, the pivot arm 32 can either occupy a position shown with a solid line where the roller 34 comes into contact with the outer periphery 2b of the wafer 2, or another position shown with a broken line where the roller 34 is apart from the wafer 2.

Under a condition that the roller 34 engages with the wafer 2 as shown in FIG. 5, the wafer 2 can be rotated in the direction of d by the roller 34 rotating in the direction of e.

The device 21 as constructed hereinabove operates as follows.

In operation, at first, all supports 24 are moved in the direction of a' by a suitable means to enlarge a space surrounded by the supports 24. Then, to maintain the positions of the supports 24, the wafer 2 to be processed is positioned into the space defined by the supports 24, and then forces on the supports 24 in the direction of a' are released.

Consequently, each support 24 is moved radially inward (the direction a) and whereby the wafer 2 can be rotatably supported. Under a condition that the wafer 2 is supported by all of the supports 24, cleaning processes as shown in FIGS. 7A to 7C are executed for the wafer 2.

Figure 7A:
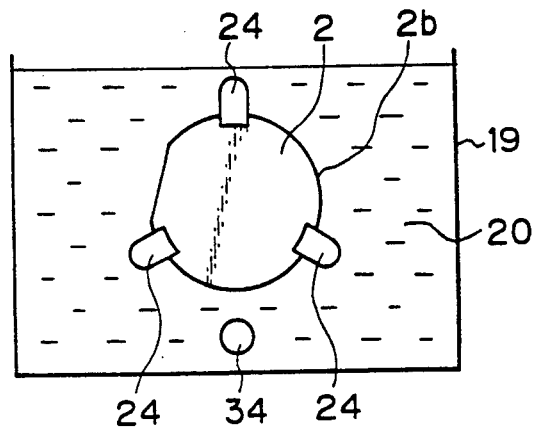
FIG. 7A, 7B and 7C are schematic views, showing various supporting conditions of the device according to the second embodiment of the invention.
Figure 7B:
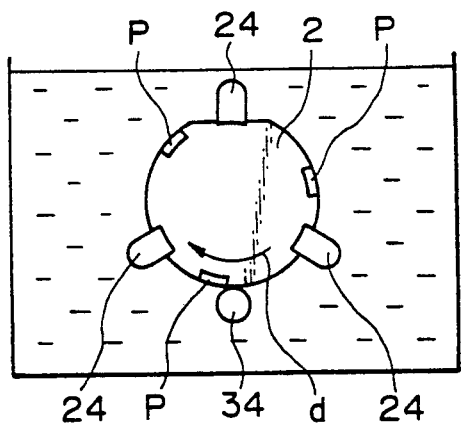
Figure 7C:
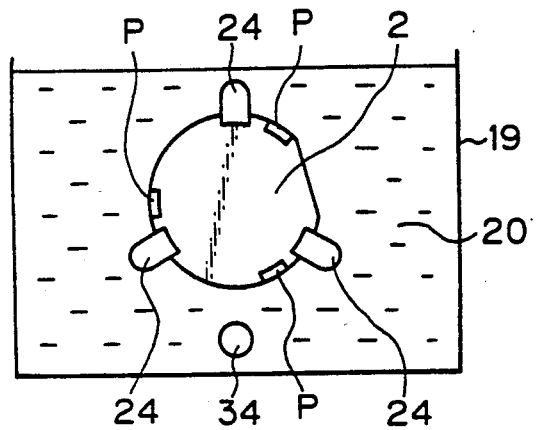

FIGS. 7A, 7C and 7B show two supporting configurations in the cleaning process for the wafer 2 and the intermediate process therebetween, respectively. Note, in these figures, the supports 24 and the roller 34 are deleted for clarity of the relative position thereof.

In the partial cleaning process shown in FIG. 7A, the wafer 2 is supported by the supports 24 in the same relationship, between the supports 24 and the wafer 2, as that of FIG. 5 and then cleaned in the washer 19 filled with the wash 20. At this time, the roller 33 is separated from the outer periphery 2b of the wafer 2.

After finishing the partial cleaning process under the condition shown in FIG. 7A, the pivot arm 31 (FIG. 5) is activated so that the roller 34 contacts the outer periphery 2b of the wafer 2, and simultaneously the roller 34 is rotated by the motor 33 (FIG. 5). Consequently, as shown in FIG. 7B, the wafer 2 is rotated in the direction of d, so that three edge portions P of the wafer 2, which have been supported by the supports 24 in FIG. 7A, are exposed directly to the wash 20.

When the roller 32 is driven for rotation for a predetermined time whereby the wafer 2 is turned through a given angle about a center thereof, the motor 33 is deactivated to stop the rotation of the roller 34 and is separated from the wafer 2, as shown in FIG. 7C.

In a supporting condition shown in FIG. 7C, the cleaning process in the latter half is executed, so that the portions P, where the cleaning effect of the wash has been incomplete in the former half of the cleaning process, can be effectively cleaned. As a matter of course, three edge portions supported by the supports 24 in this latter half are different from the portions P in the former half of the cleaning process.

Note, regarding the above-mentioned cleaning process in FIGS. 7A to 7C, it will be seen by those skilled in the art that the process may be repeated through a few cycles to effect the cleaning.

Finally, after finishing the cleaning of the wafer 2, the device 21 will be picked up from the washer 19 and then the wafer 2 is detached from the device 21 by moving the supports 25 radially outward.

Although embodiments of the present invention have been described herein with reference to the attached drawings, many modifications and changes may be made by those skilled in the art without departing from the scope of the invention.

For example, in connection with the second embodiment, by associating the supports 24 with any driving mechanism, the function of the supports 24 to rotatably support the wafer 2 may be attained by an operation of the mechanism to move the supports 24 radially outward with a slight stroke before turning the wafer 2.

As described above, according to the present invention, by constructing the device for supporting the wafer in such a manner that either the supports or the wafer can be moved, the edge portions of the wafer, that were originally supported, can be exposed and thereby cleaned.

We claim:

1. A device for supporting a wafer, comprising:
   a base plate;
   a group of first supports circumferentially arranged at regular intervals on said plate to support a periphery of the wafer above said plate, and a group of second supports circumferentially arranged on said plate, in spaced relation to each of the first supports, to support the periphery of the wafer above said plate, each of the first and second supports being movable between a supporting position for supporting the wafer and a releasing position, radially outward of said supporting position, in which the support is released from the wafer;
   releasing means urging each of said first and second supports radially outwardly toward said releasing position; and
   means for alternatively
   (1) moving each of said first supports into said supporting position while simultaneously allowing said releasing means to urge each of said second supports into said releasing position or
   (2) moving each of said second supports into said supporting position while simultaneously allowing said releasing means to urge each of said first supports into said releasing position, said alternatively moving means including an annular member rotatably mounted on said base plate, said annular member having a plurality of internal projections circumferentially arranged along an inside surface of said annular member in correspondence with said first and second supports.

2. A device according to claim 1, wherein each of said first and second supports can occupy said supporting position by an engagement thereof with the corresponding internal projection.

3. A device according to claim 2, wherein each of said internal projections has a contour inclined to the inside surface of said annular member.

4. A device according to claim 3, wherein a direction of inclination of the contour of one internal projection is opposite to a direction of inclination of the contour of the neighboring internal projection.

5. A device according to claim 1, wherein each of said supports is provided with a groove by which the wafer is rotatably supported.

* * * * *